United States Patent [19]

Tarczy-Hornoch et al.

[11] Patent Number: 4,630,228

[45] Date of Patent: Dec. 16, 1986

[54] TRANSMISSION LINE ANALYZER FOR AUTOMATICALLY IDENTIFYING THE SEVERITIES AND LOCATIONS OF MULTIPLE MISMATCHES

[75] Inventors: Zoltan Tarczy-Hornoch, Berkeley; Asad M. Madni; Joseph Fala, both of Los Angeles, all of Calif.

[73] Assignee: Systron-Donner Corporation, Concord, Calif.

[21] Appl. No.: 392,459

[22] Filed: Jun. 28, 1982

[51] Int. Cl.⁴ .......................... G06G 7/19; H04B 3/46
[52] U.S. Cl. ...................................... 364/576; 324/52; 364/482; 364/492; 379/26
[58] Field of Search ................... 179/175.3 F; 324/52; 361/1, 35, 42, 45; 364/484, 485, 492, 493, 576, 726, 482, 483

[56] References Cited

U.S. PATENT DOCUMENTS 4,313,169 1/1982 Takagi et al. ........................ 364/492
4,440,985 4/1984 Federico et al. ............. 179/175.3 F

OTHER PUBLICATIONS

IEEE Trans. on IM, Dec. 1980 (vol. IM-29, No. 4), "Calculable Physical Impedance References in Automated Precision Reflection Measurement", Peter D. Lacy and W. Oldfield, pp. 390–395.
Control Engineering, Mar. 1970, "Computerizing Fourier Analysis", Joseph R. Guerriero, pp. 90–94.
Microwave Journal, A. Madni & Z. Tarczy-Hornoch, Nov. 1981, vol. 24, No. 11.
Versatile Roles for Processed Scalar Network Analyzer Data, P. Lacy, Wiltron Company, published Apr. 1982, in the Microwave Journal, p. 57.

Primary Examiner—Felix D. Gruber
Assistant Examiner—Kevin J. Teska
Attorney, Agent, or Firm—Flehr, Hohbach, Test, Albritton & Herbert

[57] ABSTRACT

A transmission line analyzer for automatically identifying the severities and locations of multiple mismatches generates a ripple waveform which is digitally analyzed by a fast fourier transform method. Foreign and harmonic signals are rejected, and return loss at each mismatch accurately determined.

5 Claims, 14 Drawing Figures

SIMPLIFIED SYSTEM DIAGRAM

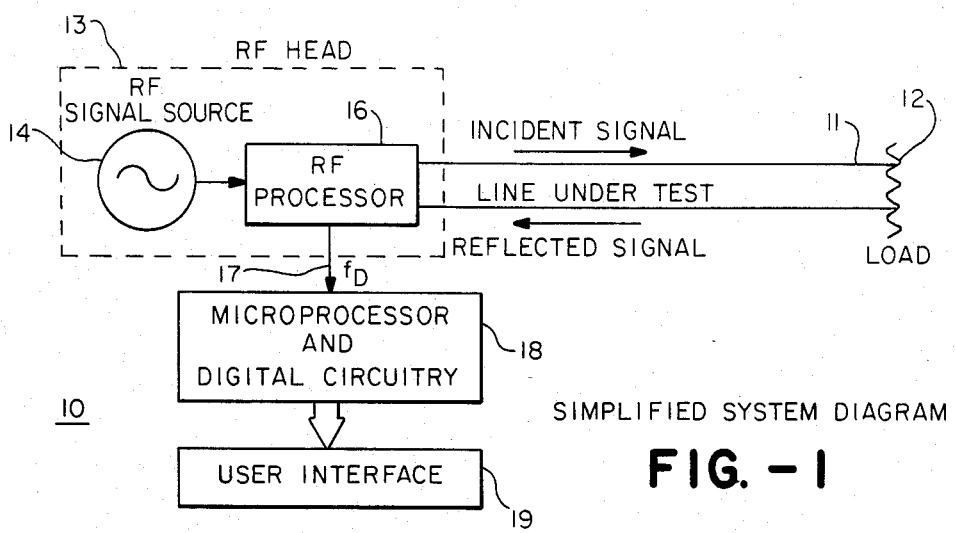
SIMPLIFIED SYSTEM DIAGRAM
FIG. -1
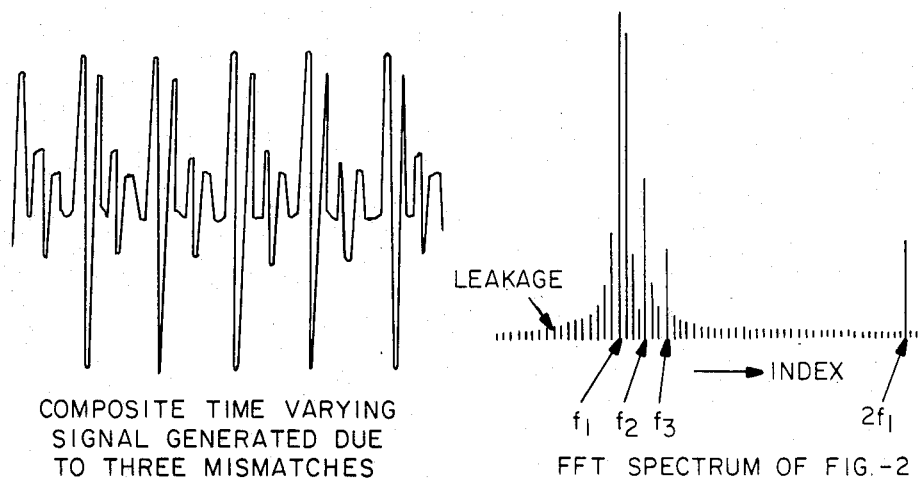
COMPOSITE TIME VARYING
SIGNAL GENERATED DUE
TO THREE MISMATCHES
FIG. -2
FFT SPECTRUM OF FIG.-2
FIG. -3
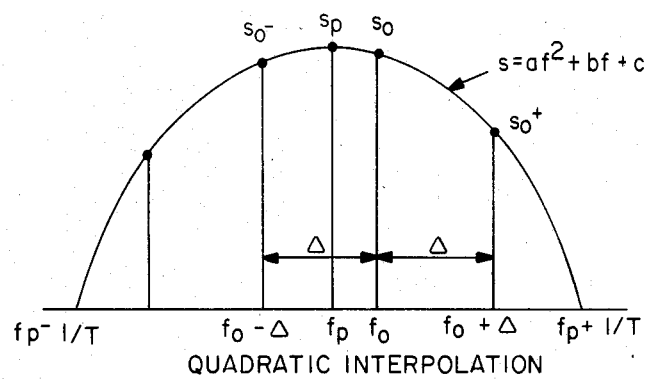
QUADRATIC INTERPOLATION
FIG. -4

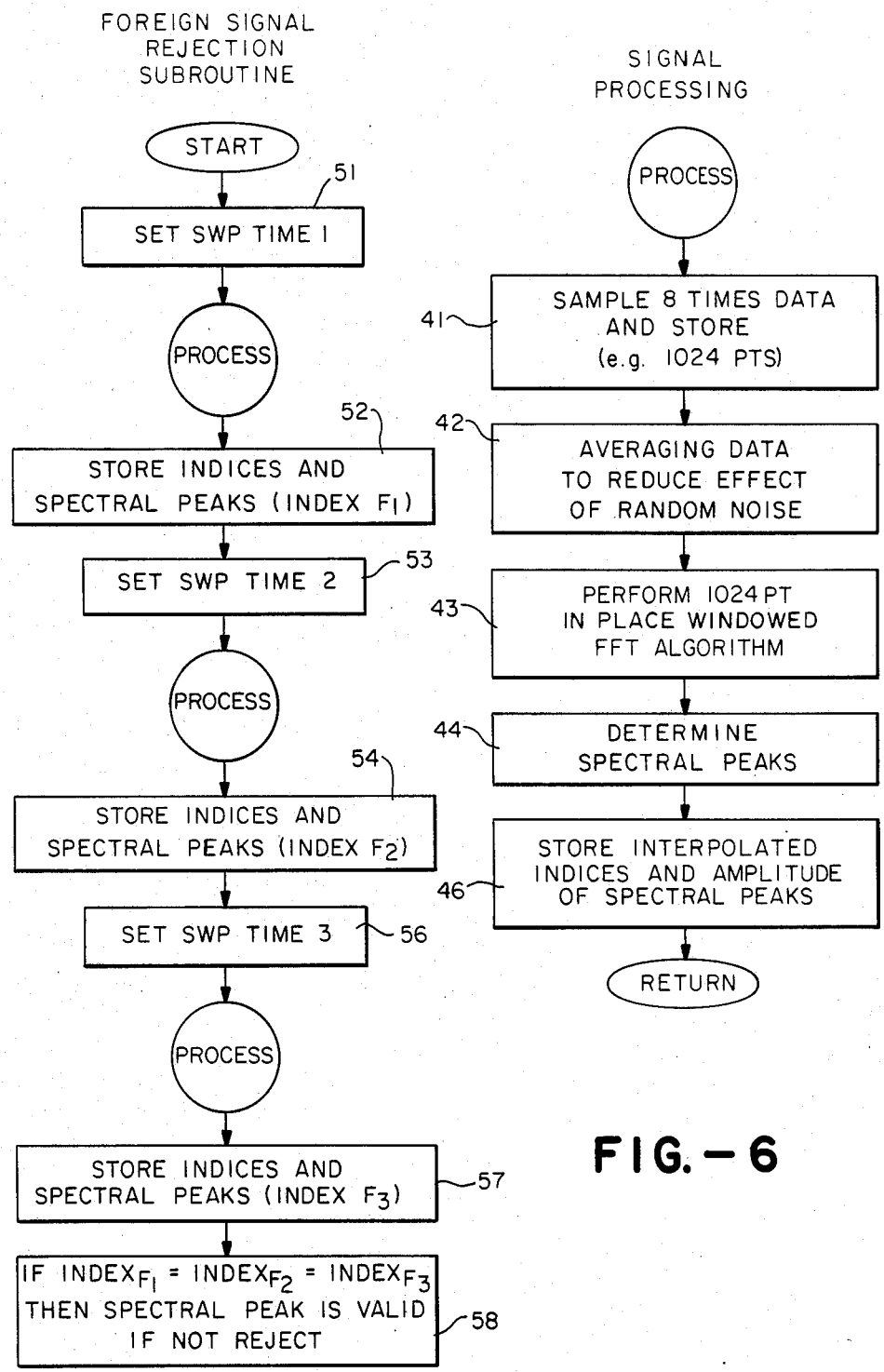

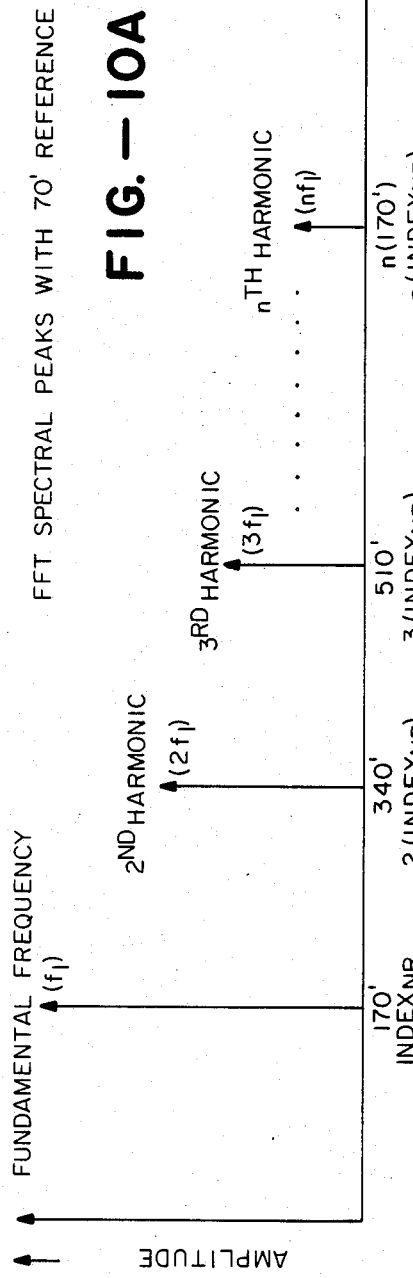
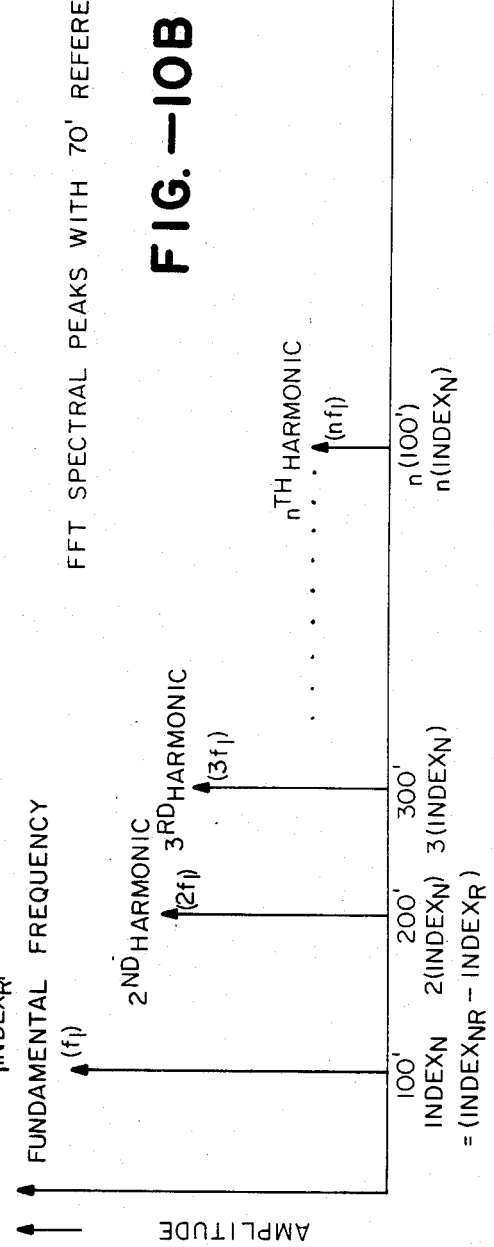

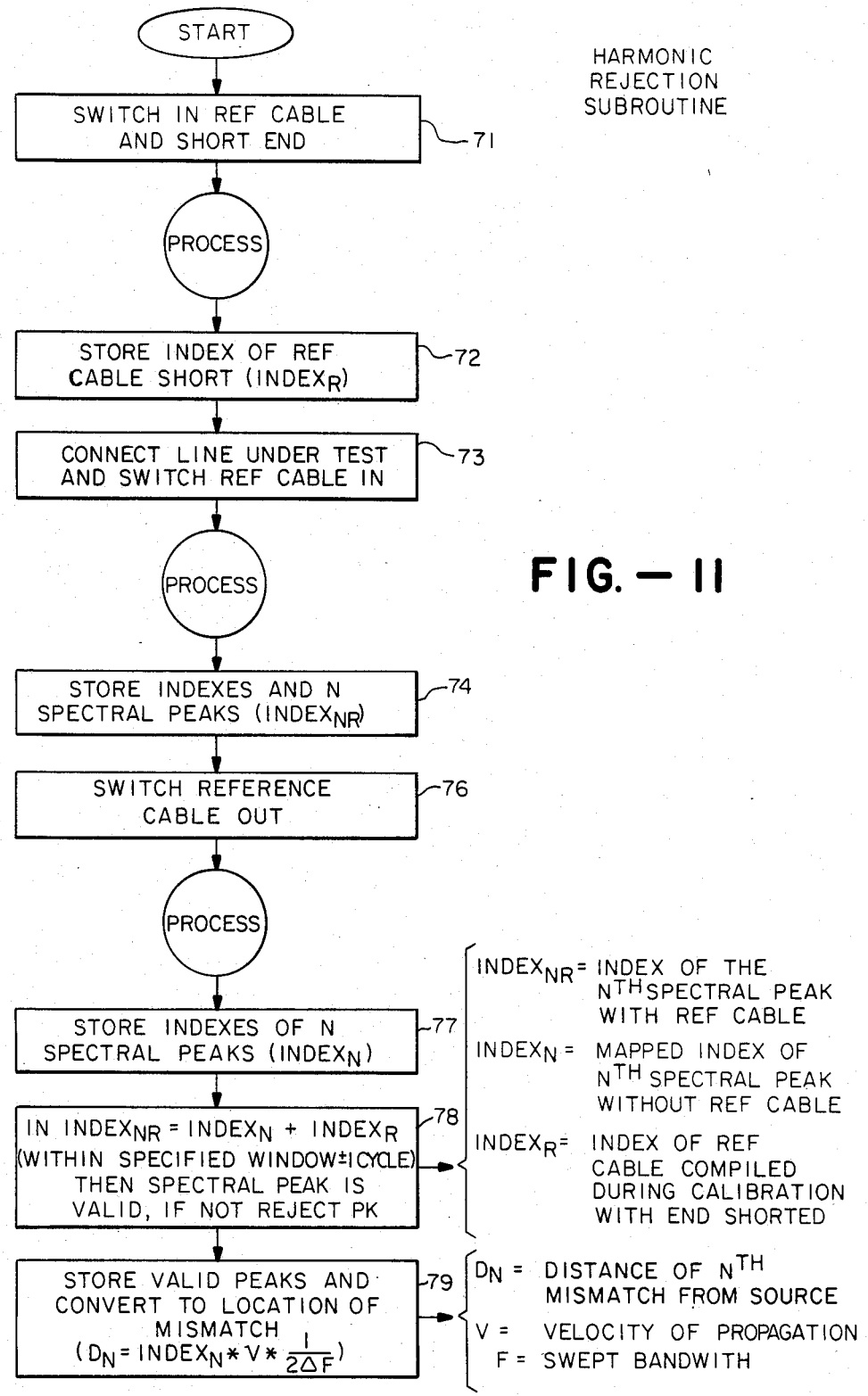
FIG. — 11

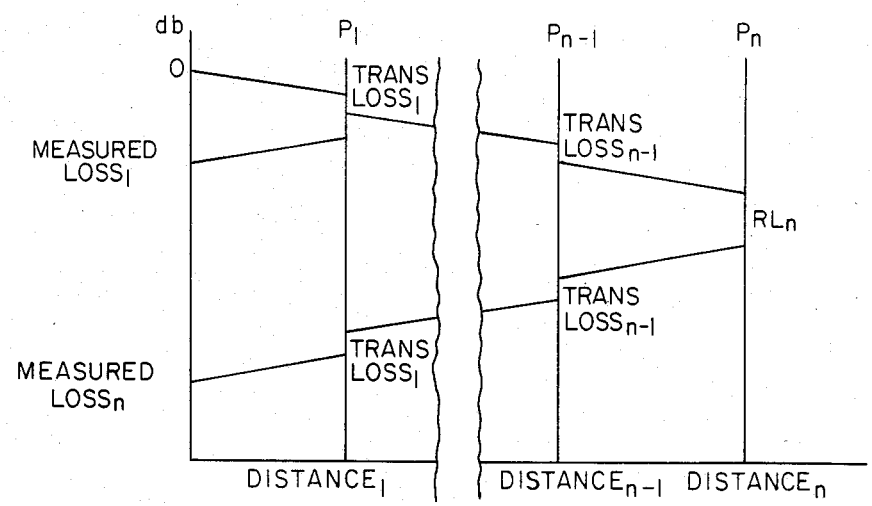
FIG. — 12
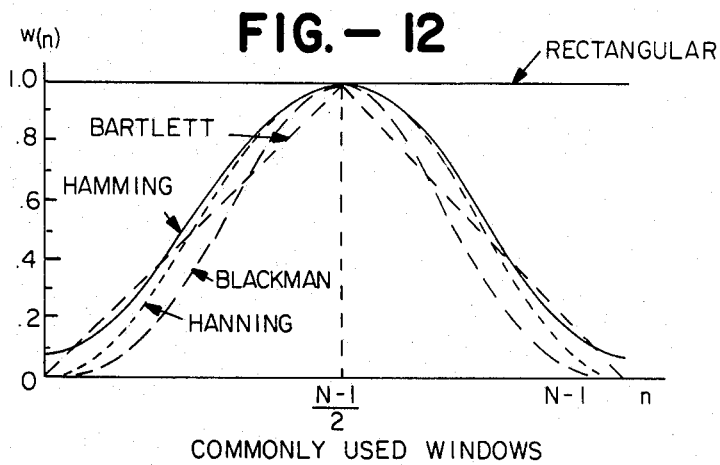
COMMONLY USED WINDOWS
FIG. — 13
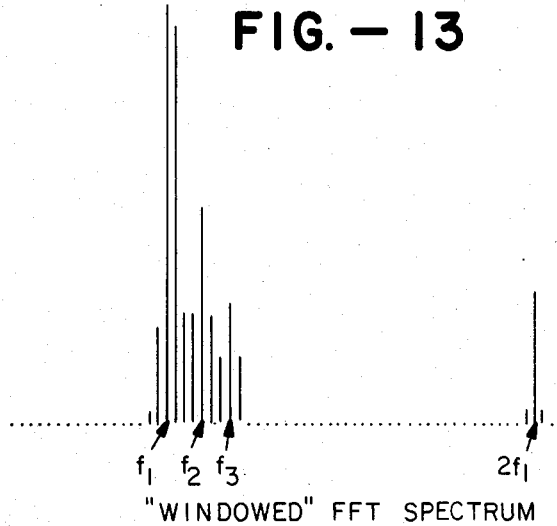
"WINDOWED" FFT SPECTRUM
FIG. — 14

TRANSMISSION LINE ANALYZER FOR AUTOMATICALLY IDENTIFYING THE SEVERITIES AND LOCATIONS OF MULTIPLE MISMATCHES

The present invention is directed to a transmission line analyzer for automatically identifying the servities and locations of multiple mismatches.

A signal applied to a uniform, lossless transmission line (waveguide or coaxial) terminated in an impedance different from its characteristic impedance produces both an incident and a reflective traveling wave. The interference or superposition of the incident and reflective traveling waves will produce a stationary wave called a standard wave. Any mismatch (discontinuity) in the uniform characteristic impedance of the transmission line generates reflections. These mismatches can be produced by the terminating load, connectors, junctions, bends, holes, transitions, tuning screws, support bends, etc. And most importantly a mismatch may occur because of damage to the transmisson line.

In communication systems, it is necessary to evaluate the quality of the transmission lines since imperfections among those listed above will create distortion and "echo". Figures of merit used to evaluate the transmission line are commonly referred to as: voltage standing wave ratio (VSWR) to return loss (RL) or reflection coefficient ($\rho$).

Among the systems used to characterize transmission line systems are: the conventional reflectometer, the time domain reflectometer, and the swept measurement method. In the conventional reflectometer method, a radio frequency (RF) signal is coupled into the transmission line under test using a slotted line and the minimum and maximum amplitudes of the standing waves are observed. When the system includes several discontinuities, the VSWR measurement does not resolve them.

In the time domain reflectometer (TDR) method, an extremely narrow pulse is fed into the tested system, and a reflection occurs each time the ulse encounters an impedance mismatch. This method is difficult to apply to low frequency or narrow band communication systems, but most importantly, in the case of multiple discontinuities, the evaluation of a cathode ray tube display is very difficult even for an experienced user.

In the swept frequency measurement technique, the frequency is swept over a bandwidth and the standing waves are displayed on a cathode ray tube. Again, as in the foregoing method, interpretation of multiple mismatch displays require great operator skill.

In addition, all of the above techniques provide mismatch data only as it appears at the point of power or pulse insertion. True values by manual computation which, for example, correct for transmission line attenuation are only approximate. Thus, it is a general object of the present invention to provide an improved transmission line analyzer capable of easily and rapidly characterizing the locations and magnitudes of multiple mismatches.

In accordance with the above object, there is provided a transmission line analyzer for automatically sensing at least the location of discontinuities in a line comprising frequency domain reflectometer means for providing a complex, composite, time-varying signal containing the location information. Fast fourier transform means automatically process the complex signal to determine spectral peaks. These peaks are then converted to the location of the discontinuity.

FIG. 1 is a simplified system diagram of the present invention.

FIG. 2 is a composite signal which would be present on the transmission line.

FIG. 3 illustrates spectral peaks produced by a fast fourier transform.

FIG. 4 illustrates a technique of quadratic interpolation used for locating the spectral peaks of FIG. 3 more accurately.

FIG. 6 is a signal processing algorithm which forms the peaks of FIG. 3.

FIG. 7 is a subroutine which eliminates foreign signals.

FIGS. 10A and 10B are graphs useful in understanding the operation of FIG. 9.

FIG. 11 is a flow chart illustrating the operation of FIG. 9.

FIG. 12 is a graph illustrating another embodiment of the invention used for improved accuracy in determining the return loss and reflection coefficient of each mismatch.

FIG. 13 are curves of windows.

FIG. 14 is a windowed spectrum of FIG. 3.

Figure 5:
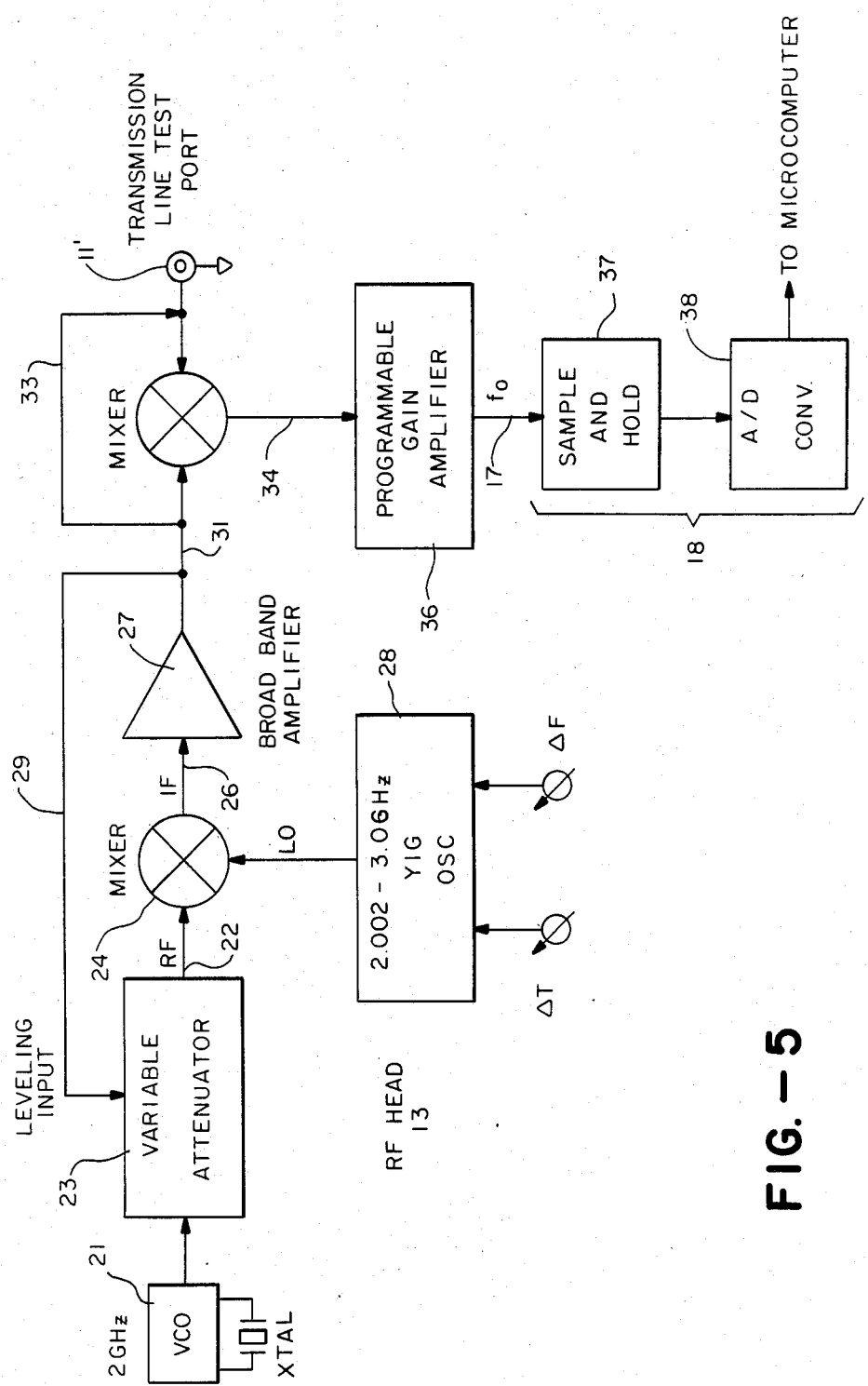
FIG. 5 is a more detailed block circuit diagram of portions of FIG. 1.

FIG. 1 shows a simplified system diagram of a transmission line analyzer unit 10 connected to a transmission line 11 under test. And the transmission line is shown as having a load 12 which, for example, might be an antenna.

The analyzer includes a ratio frequency head portion 13 which has as components a radio frequency source 14 and an RF processor 16. The RF head 13 is basically a homodyned receiver which sends swept incident RF power down the transmission line 11 under test. Each time an impedance mismatch or discontinuities are encountered, part of the power is reflected back creating standing waves. The incident and reflected power are hetrodyned in RF processor 16 to produce a difference frequency $f_D$ on line 17 which is directly proportional to the distance of the mismatch from the source, the swept bandwidth, and inversely proportional to the sweep time and the velocity of propagation for the line under test and is expressed by:

$$f_{Dn} = \frac{\Delta F}{\Delta T} \cdot \frac{2D_n}{v}$$

where $f_{Dn}$ is the difference frequency generated due to the nth mismatch $\Delta F$ is the swept bandwidth $\Delta T$ is the sweep time $D_n$ is the distance of the nth mismatch from the source and v is the velocity of propagation for the line under test This is a well-known mathematical relationship. When multiple mismatches are present in the line, the resulting hetrodyned ripple waveform (interference pattern, standing waveform) is a complex, composite, time-varying signal. As discussed above, the evaluation of this signal on a cathode ray tube (CRT) display to identify the various difference frequencies is extremely difficult; and in most cases, not possible. FIG. 2 illustrates the complex nature of the time-varying signal which, for example, has been generated due to three mismatches. However, when this composite signal is spectral analyzed and observed in the frequency domain, information on each fault within the transmission line system under test is easily obtained.

In accordance with the invention, spectral analysis is accomplished by digitizing the complex waveform and processing the digital information via a fast fourier transform (FFT) algorithm. Such digitized spectrum is illustrated in FIG. 3. Each difference frequency is represented by a spectral peak whose index (that is, the horizontal frequency axis) is proportional to the distance of the fault from the source, and whose amplitude is representative of the VSWR of the fault. A significant advantage of this frequency domain processing technique is the ability to detect multiple faults in a single pass of the swept frequency and to reject harmonic and interference signals by digital filtering and correlation techniques.

Additionally, besides obtaining the amplitudes of the mismatches as they appear at the point of power insertion (RF head connector), the true amplitudes may be obtained after using an amplitude correction algorithm.

Thus, as illustrated in FIG. 1, the difference frequency on line 17 is processed by a microprocessor and digital circuitry indicated at 18 to produce the spectral peaks illustrated in FIG. 3, and then by a user interface 19 this information may be printed out in a format which will show the location in feet of the mismatch, the corrected return loss of that particular mismatch and its corresponding VSWR, and moreover, if desired, the percent contribution of this return loss to the composite return loss/VSWR at the point of power insertion. Referring specifically now to FIG. 3, the three peaks which have been indicated have been designated $f_1$, $f_2$ and $f_3$ with an unwanted harmonic $2f_1$ also being produced. Also the low level signals are indicated as leakage. By a technique of windowing, which is well-known per se (see Vol. 66, No. 1, January 1975, Proceedings of the IEEE, an article by Frederick J. Harris "ONE THE USE OF WINDOWS FOR HARMONIC ANALYSIS WITH THE DISCRETE FOURIER TRANSFORM"), the spectrum can be enhanced to produce a cleaner spectrum as shown in FIG. 14 where the effects of leakage are minimized. Thus, the present invention, for the first time, has used the concept of windowing to enhance location and amplitude data. Using the windowing technique (and specifically a generalized Hamming) with the fast fourier transform, reduces the effect of leakage caused by the effect of truncation at other than a multiple of the period of the complex time varying signal. This results in a more precise amplitude and location figure for the fault (mismatch). Further, where one mismatch is placed close to another larger mismatch, the effect of leakage can totally or partially mask the smaller mismatch.

WINDOWING TECHNIQUE

In order to reduce leakage, it is necessary to employ a time domain truncation function (window) which has sidelobe characteristic that are of smaller magnitude than those of the sin f/f function. The smaller the sidelobes, the less leakage will affect the results of the DFT.

There exist several windows which exhibit the desired characteristics. FIG. 3 shows the characteristics of some of the commonly-used windows. The test set uses the "generalized" Hamming Window to reduce effects of leakage. It is of the form:

$$W_H(n) = \qquad (6)$$

$$\begin{cases} \alpha + (1-\alpha)\cos\left(\frac{2\pi n}{N}\right) & -\left(\frac{N-1}{2}\right) \leq n \leq \frac{N-1}{2} \\ 0.0 & \text{elsewhere} \end{cases}$$

where $0 \leq \alpha \leq 1.0$. If $\alpha = 0.54$, the window is called a Hamming Window; If $\alpha = 0.5$, it is called a Hanning Window. The frequency response of this window is obtained by noting that the window can be represented as the product of a rectangular window and an infinite duration window of the form of equation (6) but defined for all n; i.e.:

$$W_H(n) = \left[W_R(n) \cdot \left[\alpha + (1-\alpha)\cos\left(\frac{2\pi n}{N}\right)\right]\right] \qquad (7)$$

where $W_R(n)$ is a rectangular window and is defined as:

$$W_R(n) = \begin{cases} 1.0 & -\left(\frac{N-1}{2}\right) \leq n \leq \frac{N-1}{2} \\ 0.0 & \text{elsewhere} \end{cases} \qquad (8)$$

The frequency response is therefore the convolution of the frequency response of the rectangular window $w_R(e^{j\omega})$ with an impulse train, which is given by:

$$W_H(e^{j\omega}) = \alpha W_R(e^{j\omega}) + \frac{(1-\alpha)}{2} W_R[e^{j(\omega - 2\pi/N)}] \qquad (9)$$
$$+ \frac{(1-\alpha)}{2} W_R[e^{j(\omega + 2\pi/N)}]$$

The frequency response resulting from equation (9) is shown in FIG. 3 as the Hamming Window. Using $\alpha = 0.54$, the composite complex-time varying signal of FIG. 2 was weighted using the Hamming Window.

The resulting windowed FFT spectrum is shown in FIG. 14. The larger the swept bandwidth, for example, which in this particular embodiment may be, for example, 40 megahertz for some types of measurements and 400 megahertz for others, the greater the resolution of the location measurement (that is, the accuracy of the distance $D_n$ of the mismatch from the source). Due to the resolution of the fast fourier transform, unless an integer number of cycles is sampled, the index corresponding to a given spectral peak will appear at the nearest integer index resulting in an inaccuracy in the distance and amplitude measurements. The true index and amplitude may be computed using a "quadratic interpolation" technique shown in FIG. 4 where the applicable second order curve is generally defined. Here "s" is the amplitude of the spectral line and "f" the frequency index. Here the apparent spectral peak designated "So" and its two adjacent spectral lines designated "So−" and "So+" as shown by the FFT spectrum have been indicated to define the second order curve. By computing the first and second derivatives of the second order curve, the maximum point on the curve, $S_p$, and the true frequency index, $f_p$, corresponding to "$S_p$" may be determined by:

$$\text{for } \Delta = 1: f_p = f_o + \frac{(s_o^+ - s_o^-)}{2(2s_o - s_o^+ - s_o^-)} \quad (20)$$

$$\text{and } s_p = s_o + \frac{(s_o^+ - s_o^-)^2}{8(2s_o - s_o^+ - s_o^-)} \quad (21)$$

where $f_o$ = frequency index of apparent peak
$f_o - \Delta$ = frequency index of adjacent spectral line to the left of apparent peak
$f_o + \Delta$ = frequency index of adjacent spectral line to the right of apparent peak
$f_p$ = frequency index of true peak
$s_o$ = amplitude of apparent spectral peak
$s_o^-$ = amplitude of spectral line to the left of apparent peak
$s_o^+$ = amplitude of spectral line to the right of apparent peak
$s_p$ = amplitude of true peak
$\Delta$ = displacement of neighbours from apparent spectral peak.

This results in a more precise amplitude and distance figure for the fault or mismatch. Accuracies of ±18 inches have been achieved with a 40 megahertz sweep bandwidth using quadratic interpolation. For greater sweep bandwidth (e.g., 400 MHz) accuracies of better than three inches have been achieved.

Referring again to FIG. 3, the frequency index can be utilized to convert the actual location of the mismatch by the following formula:

$$D_n = \text{Index}_n * v * \frac{1}{2\Delta F}$$

where $D_n$ is the distance of the nth mismatch from the source, v is the velocity of propagation for the line under test, and $\Delta F$ is the swept bandwidth. $\text{Index}_n$ is the mapped index of the nth spectral peak as taken from the digitally stored peaks of FIG. 3 after quadratic interpolation.

Referring now to FIG. 5, which illustrates all of the radio frequency signal processing circuitry as contained in the 2 MHz to 1000 MHz RF head 13 (also shown in FIG. 1), the RF signal from source 14 is generated as follows. A crystal controlled VCO 21, for example, 2 GHz, provides an RF signal on a line 22 which is leveled by digitally controlled variable attenuator 23. A local oscillator (LO) input to a mixer 24 provides on line 26 an IF, intermediate frequency, signal which when amplified by a broadband amplifier 27 provides the swept RF source. A variable local oscillator (LO) signal is provided by the variable YIG oscillator 28 which, for example, is variable from 2.002 to 3 GHz. A swept bandwidth control is indicated by $\Delta F$ and variable control of sweep time by $\Delta T$. These are control inputs from the micro computer which may be an AIM 65 from Rockwell International of Anaheim, Calif. The feedback path 29 at the output of broadband amplifier 27 provides leveling for the IF signal on line 26 due to any error introduced by mixer 24. By providing the leveling and variable attenuator 23 at the fixed frequency RF input 22, much more accurate leveling is provided in comparison to providing leveling in the swept LO portion of the circuit.

Next, the IF output 31 of the broadband amplifier is both coupled into a mixer 32 and to the transmission line test port 11' through the line 33. The heterodyned output of mixer 32 on line 34 is amplified by programmable gain amplifier 36 to produce on line 17 the difference frequency $f_D$.

Then, in the digital circuitry 18, the analog signal on line 17 is sampled and held by the unit 37 and converted to digital format by analog-to-digital converter 38 where it is processed by the microprocessor unit. Such signal processing is illustrated by the process flow chart of FIG. 6. In step 41, the data is actually sampled eight times and averaged and stored with, for example, 1024 points of data. Averaging is accomplished by a standard averaging algorithm and is for the purpose of reducing random noise. This averaging is done in step 42. Then, in step 43, a 1024 point in place windowed FFT algorithm is performed. The windowing is by the "Hamming" technique described above. The use of a FFT in place algorithm to process electrical signals is per se known as illustrated by the fact that an integrated circuit chip Model No. S2814A from American Microsystems, Inc. will perform such a FFT. However, for the purposes of the present invention, the specific FFT algorithm used is a butterfly pattern shown in FIG. 11-4(a) on page 181 of a book entitled "THE FAST FOURIER TRANSFORM" by E. O. Brigham, Prentice-Hall Publisher, Englewood Cliffs, N.J., 1974. This algorithm will produce and store the representation shown in FIG. 3 and after windowing FIG. 14. Thereafter, the spectral peaks in step 44 are more precisely determined as, for example, as illustrated in FIG. 4, by quadratic interpolation, and such peaks are stored in step 46 and a return is made.

With the foregoing signal processing and the stored interpolated indices and amplitudes of the spectral peaks, the location of the faults can now be determined by the simple formula utilizing the number of cycles represented by the spectral peak index times the propagation velocity divided by double the sweep bandwidth. However, first it is desirable to remove foreign signals which might have been introduced into the transmission line being measured. Such foreign signals are random or semi-random electromagnetic noise from various sorces; for example, on a ship where a radar waveguide is being measured, wind and wave action may cause these random signals. More serious non-random signal sources which contribute foreign signals would include other transmitters, radar and other navigation equipment on a ship plus numerous communication signals which may be present. All these signals tend to distort the FFT spectrum. In fact, such signals can actually appear as "phantom" discontinuities on the tested transmission line.

Figures 8A, 8B:
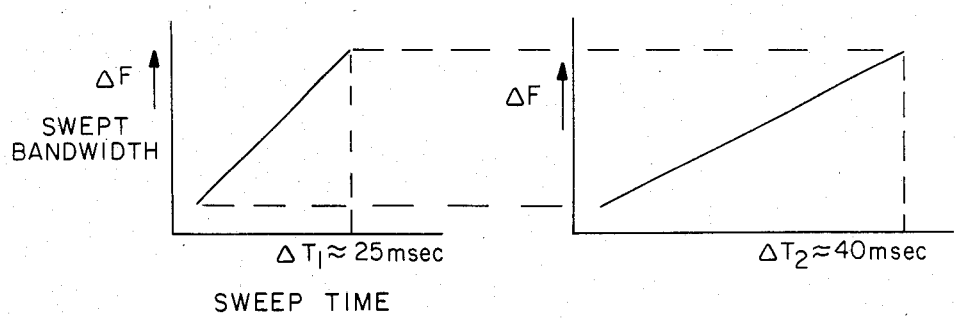
FIGS. 8A and 8B are graphs which explain the operation of FIG. 7.
Figures 8C, 8D:
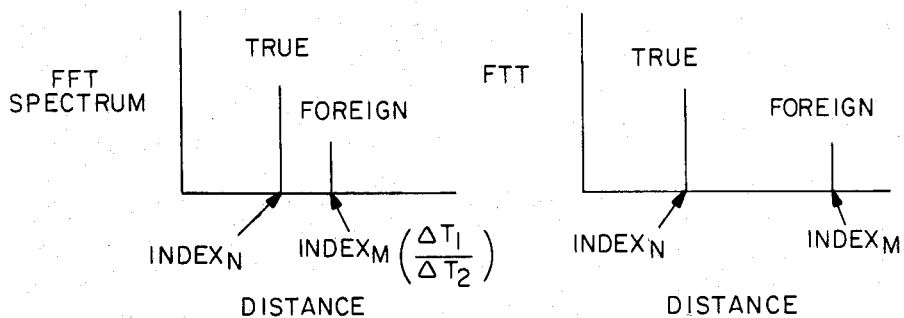

To eliminate these signals, the present invention provides for change of the sweep time, $\Delta T$. For example, as shown in FIGS. 8A and 8B, one sweep time might be 25 milliseconds and the second in FIG. 8B 40 milliseconds. The respective results of these sweeps in terms of the FFT spectrum is shown in FIGS. 8C and 8D. Here the spectral peak labeled true occurs at the same relative distance or index ($\text{Index}_n$) for both sweep times. However, the foreign signals do not follow the expected transformation and will occur as illustrated in FIG. 8D in comparison to FIG. 8C at a different distance as determined by the sweep time ratio $\Delta T_1/\Delta T_2$. Thus, by making the comparison of, for example, the spectrums of FIGS. 8C and 8D and rejecting any signal that does not have a matching signal, foreign spectral peaks can be eliminated.

Foreign signals can also be eliminated by varying swept bandwidth, $\Delta F$. Here, however, the true signals move in accordance with the ratio $\Delta F_1/\Delta F_2$ and foreign signals do not; thus, here a match will trigger a rejection whereas a signal that maps in this ratio will be considered true.

In practice, the actual foreign signal rejection subroutine is shown in FIG. 7 where actually three different sweep times are utilized to increase the accuracy of the foreign signal rejection. In step 51, the first sweep time is set and the process routine of FIG. 6 is gone through which ends in the storage of the spectral peaks of the first sweep time which are designated index $F_1$ in step 52. Then, in step 53, a second sweep time of perhaps longer is set and the signal processing occurs resulting in indices or spectral peaks stored as index $F_2$ in step 54. Then, in step 56, a third sweep time is set the resulting signal processed and in step 57 index $F_3$ peaks stored.

In step 58, a comparison is made to see whether corresponding peaks have occurred at the same index or location in the three stored spectral peaks. If there is a corresponding peak, the spectral peak is valid; if not, it is rejected.

In addition to foreign signals, harmonics generated by the FFT appear as discontinuities. These must also be rejected to prevent any phantom discontinuities from being indicated. Preferably, in the preferred embodiment, this is done after the elimination of foreign signals. Thus, the spectral peaks which are actually stored are all valid.

Figure 9:
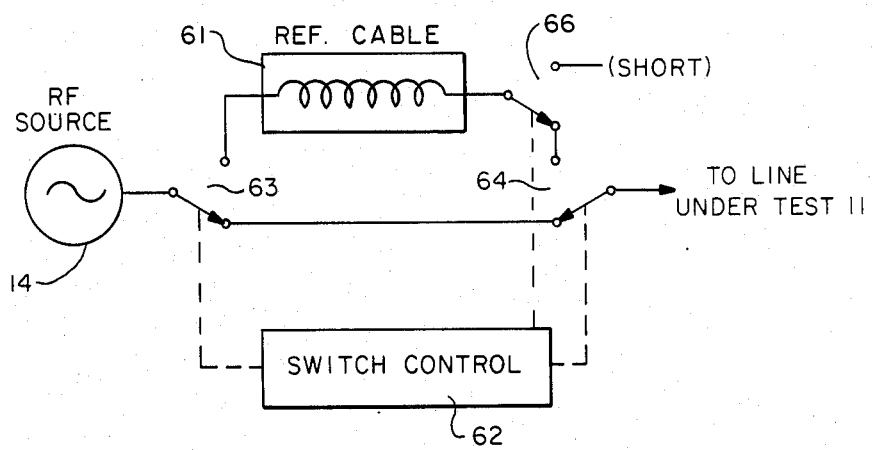
FIG. 9 is a schematic circuit diagram of an alternative embodiment of the invention used to eliminate or reject harmonics.

Specifically, the technique of eliminating such harmonics is the realization that harmonics do not map in a predicted manner as do the true reflected signals. As illustrated in FIG. 9, to strip out the harmonic signals from the spectral peak output produced by the fast fourier transform algorithm, a reference cable 61 of a predetermined length (for example, 70 feet) is provided. By means of a switch control unit 62 and switches 63 and 64, the signal path as shown has RF source 14 directly connected to the line under test 11. Then, in the alternative with the switches in their opposite location, the reference cable 61 is physically added to the transmission line. Thus, referring to FIG. 10B, with no reference cable in the line, for example, a frequency $f_1$ may occur at a distance of 100 feet of the line and a second harmonic $2f_1$ occurs double that distance or 200 feet. Then, as illustrated in FIG. 10A, when the, for example, 70 feet of reference cable 61 is physically added, the true spectral peak $f_1$ will occur at 170 feet with the spurious second harmonic at double the distance or 340 feet. In accordance with the invention, to eliminate or reject the spurious harmonics, the spectral peaks of FIG. 10B have arithmetically added to them the equivalent length of the reference cable of 70 feet and thus the spectral peaks $f_1$ would be 170 feet but the spurious harmonic $2f_1$ would be 270 feet. Since this would not have a correspondence with the 340 feet in FIG. 10A, it would be rejected.

In practice, however, rather than merely adding the equivalent length of the reference cable, in order to compensate for changes in propagation constant which might occur over a temperature range the reference cable 61 as illustrated in FIG. 9 is actually switched to a shorted condition by switch 66, the switch 63 connecting the other end to the RF source 14. This, thus, provides a spectral peak representing the equivalent length of the cable of index ($Index_R$) of which can be added to the index of the peaks of FIG. 10B to provide the above comparison with the indices of FIG. 10A. In a similar manner, all harmonics (2nd, 3rd . . . nth) which do not map in a predictable manner are rejected. FIG. 11 illustrates the specific subroutine for accomplishing harmonic rejection. In step 71, the reference cable is switched in by switch 63 and it is shorted by switch 66. Then the signal processing of FIG. 6 is utilized to provide a resulting spectral peak and the resulting $Index_R$ of the reference cable is stored in step 72. This, thus, as discussed above, provides the equivalent length of the reference cable which automatically, of course, compensates for any variation in propagation constants. However, it should be kept in mind, depending on the ambient conditions and accuracy desired, that such step may not be necessary. Next, in step 73, the line under test is connected or switched in meaning that switch 66 is moved to the condition shown in FIG. 9 and switch 64 is switched to its other position. Again, the signal processing is accomplished and the resulting indices of spectral peaks designated $Index_{NR}$ in 74 are stored. In step 76, the reference cable is switched out to produce the switch positions actually shown in FIG. 9 and spectral peaks generated and stored as indicated in 77 with spectral peaks indicated as $Index_N$. In 78, a test is made for corresponding validity of all the peaks by comparing the spectral peaks $Index_{NR}$ (that is, the index of the nth spectral peak with the reference cable) with the summation of the $Index_N$ (the mapped index of the nth spectral peak without the reference cable) plus the $Index_R$ (the index of the reference cable computed during calibration with the end shorted). If this equality is operative, then the spectral peak is valid. Step 79 then states that the valid peaks are stored and converted to the actual location of the mismatch in accordance with the stated formula. And, at this time, of course, the amplitude information of the spectral peaks is used to determine the severity of the mismatch.

In order to enhance the rejection of harmonics in step 78, the index comparison can be made within a specified window, for examle, plus minus one cycle. This, of course, will reject a greater amount of spurious harmonic peaks.

In computing return loss for each mismatch or discontinuity and its associated reflection coefficient at that mismatch, it has been found that the apparent reflection coefficient must be corrected with several factors. These include, as is well-known, at least the attenuation of the transmisson line in both directions, and the attenuation of the coupler if present in the system under test. However, in the past, the attenuation due to intervening mismatches in both the forward and reverse direction have been neglected. Perhaps this is true in part to the impossibility of accurately computing multiple mismatches. In any case, as provided by the present invention, the generalized formula for return loss is as follows:

$$\text{MEASURED LOSS}_n = 2\begin{bmatrix}TRANS\\LOSS_1\end{bmatrix} + \cdots + 2\begin{bmatrix}TRANS\\LOSS_{n-1}\end{bmatrix} +$$

$$RL_n + \begin{bmatrix}TOTAL\\ATTEN_n\end{bmatrix} + \begin{bmatrix}COUPLER\\ATTEN\end{bmatrix}$$

-continued $$= \sum_{k=1}^{n-1} 2 \begin{bmatrix} TRANS \\ LOSS_k \end{bmatrix} + RL_n + \begin{bmatrix} TOTAL \\ ATTEN_n \end{bmatrix} + \begin{bmatrix} COUPLER \\ ATTEN \end{bmatrix}$$

$$RL_n = \begin{matrix} MEASURED \\ LOSS_n \end{matrix} - \sum_{k=1}^{n-1} 2 \begin{bmatrix} TRANS \\ LOSS_k \end{bmatrix} - \begin{bmatrix} TOTAL \\ ATTEN_n \end{bmatrix} - \begin{bmatrix} COUPLER \\ ATTEN \end{bmatrix}$$

where

COUPLER ATTEN = ONE OR TWO WAY ATTENUATION DUE TO A COUPLER OR HIGH ATTENUATION DEVICE IF ANY

TRANSMITTED $LOSS_k$ = $10 \log(1 - \rho_k^2)$

MEASURED $LOSS_n$ = $-20 \log \left( \dfrac{\text{MEASURED SPECTRAL HEIGHT}}{\text{REFERENCE SPECTRAL HEIGHT}} \right)$ $$\begin{matrix} TOTAL \\ ATTEN_n \end{matrix} = \dfrac{2 \times DISTANCE_n}{100} \times \text{ATTENUATION IN } DB/100 \text{ ft}$$

$$RL_n = -20 \log \left( \dfrac{SH_n}{SH_R} \right) - \left[ \sum_{k=1}^{n-1} -20 \log(1 - \rho_k^2) \right] - \left[ \dfrac{D_n}{50} \times ATTEN. \right] - \begin{bmatrix} COUPLER \\ ATTEN \end{bmatrix}$$

where
$RL_n$ = corrected return loss of nth mismatch or discontinuity
$\rho_n' = SH_n/SH_R$ = apparent reflection coefficient of nth mismatch
$\rho_K$ = corrected reflection coefficient of each intervening mismatch
ATT = attenuation of transmission line in dB/100 feet
COUPLER ATT = attenuation due to presence of coupler or high attenuation device
$D_n$ = location from source of nth mismatch
$SH_n$ = spectral height of nth mismatch from source
$SH_R$ = spectral height of short at the end of reference cable computed during calibration
$\rho_n = 10(RL_n/20)$ and
$VSWR_n = 1 + \rho_n/1 - \rho_n$ Thus, to summarize the foregoing equation, the first term provides the apparent return loss at the source, the third term is the line attenuation both in the forward and reverse directions both for the incident and reflected signal, the fourth term is the coupler attenuation if present in the system under test, and the middle term the intervening losses in both the incident and reflected directions caused by the intervening mismatches. FIG. 12 illustrates a line with n mismatches and illustrates the relative decibel loss caused by both the transmission line attenuation and passing through an intervening mismatch. For example, in the case of the nth mismatch, the loss is illustrated in both directions due to the intervening mismatches #1 through 17. With the foregoing technique, accurate return losses can now be calculated.

In practice, to execute the generalized formula, it is a step-by-step successive procedure where, for example, the return loss $RL_1$ for the first mismatch in the transmission line is calculated by use of the first apparent reflection coefficient and merely the attenuation in the line. Then the antilog of this reflection coefficient divided by 20 provides the corrected coefficient. Of course, for the first mismatch, there is no intervening mismatch and resulting attenuation to take account of. Then this return loss for a second mismatch further down the line is computed in accordance with the above formula and the corrected coefficient for the first mismatch can be used in the equation. And this is successively done for the remaining mismatches.

The present invention also determines the percentage contribution of each mismatch to the overall composite VSWR as seen at the RF head connector; i.e., point of power insertion. Referring to FIG. 6, steps 41 and 42, during calibration the peak to peak amplitude of the composite time-varying signal is computed (RA). Then during the measurement the peak to peak amplitude is also measured (MA). The composite return loss at the connector is given by 20 log (RA/MA)

and the reflector coefficient$(\rho) = MA/CA$ and the composite $VSWR = 1 + \rho/1 - \rho$ After the FFT is performed, i.e., FIG. 6, steps 43, 44, 46, the uncorrected spectral heights are used to determine the percent contribution of each mismatch, K, the composite VSWR (return loss) as seen at the connector and is given by:

$$\% \text{ contribution of } n\text{th mismatch} = \dfrac{SH_n}{\sum_{K=1}^{K=n} SH_K} \times 100$$

where $SH_n$ is the spectral height of the nth peak and $$\sum_{K=1}^{K=n} SH_K$$

is the sum of all the spectral heights.

Thus, the present invention has provided an improved transmission line analyzer for automatically identifying the severities and locations of multiple mismatches.

CORRELATION FOREIGN SIGNAL REJECTION

In order to determine the spectral purity of the FFT spectrum, i.e., identify true mismatches from the "foreign" signal interferences, a correlation algorithm is performed. This consists of generating three different FFT spectrums under three widely varying sweep times ($\Delta T$). This correlation takes each spectral peak and its neighbors and stores them in the peak spectrum Table X6. The boost flag is set to 1 after the first sweep so that the AGC loop and programmable gain amplifier are inactive during the second and third sweep, boosted always by the amount calculated in the first sweep.

The purpose of these three sweep (3 FFT spectrums) is to eliminate "foreign" signals. These signals will generate 3 different index spectrums whereas the true mismatch signals will generate three equivalent spectrums. Any signal with at least two equivalent spectrums will be accepted as a true signal. An X5 table or index spectrum table has 512 locations. A one is placed wherever a spectral peak line occurs and also to the immediate left and right denoting peak neighbors. The X6 table or peak spectrum table contains the amplitude of the peak and its neighbors. A spectral line at 23 with amplitude 100 would appear as:

|    | 20 | 21 | 22 | 23  | 24 | 25 | 26 |
|----|----|----|----|-----|----|----|----|
| X5 | 0  | 0  | 1  | 1   | 1  | 0  | 0  |
| X6 | 0  | 0  | 33 | 100 | 85 | 0  | 0  |

As an example for 3 sweep results:

|         | 1 | 2 | 3 | 4 | 5 | 6 | 7 | 8 | 9 | 10 | 11 | 12 | 13 | 14 | 15 | 16 |
|---------|---|---|---|---|---|---|---|---|---|----|----|----|----|----|----|----|
|         |   |   |   |   |   |   | X5 |  |   |    |    |    |    |    |    |    |
| Sweep 1 | 0 | 0 | 0 | 1 | 1 | 1 | 0 | 1 | 1 | 1  | 0  | 0  | 0  | 0  | 0  | 0  |
| Sweep 2 | 0 | 0 | 0 | 1 | 1 | 1 | 0 | 0 | 0 | 0  | 1  | 1  | 1  | 0  | 0  | 0  |
| Sweep 3 | 0 | 0 | 0 | 0 | 1 | 1 | 1 | 0 | 0 | 0  | 0  | 0  | 0  | 1  | 1  | 1  |
|         | 0 | 0 | 0 | 2 | 3 | 3 | 1 | 1 | 1 | 1  | 1  | 1  | 1  | 1  | 1  | 1  |
|         |   |   |   |   |   |   | X6 |  |   |    |    |    |    |    |    |    |
| Sweep 1 | 0 | 0 | 0 | 3 | 6 | 5 | 0 | 3 | 6 | 3  | 0  | 0  | 0  | 0  | 0  | 0  |
| Sweep 2 | 0 | 0 | 0 | 3 | 6 | 5 | 0 | 0 | 0 | 0  | 3  | 6  | 3  | 0  | 0  | 0  |
| Sweep 3 | 0 | 0 | 0 | 5 | 6 | 3 | 0 | 0 | 0 | 0  | 0  | 3  | 6  | 3  |    |    |

On one sweep there is a peak at 5 and 0 as observed from X6. On sweep 2 the peaks are 5 and 12. On sweep 3 they are 5 and 15. In the sum X6 we have peaks 5, 9, 12, and 15. But where the peak at 5 has an X5 sum of 3, those at 9, 12, and 15 have a sum of X5 of 1. This implies that for 3 different sweeps, the spectrum 5 appeared and therefore it must be valid, whereas 9, 12, and 15 must be foreign signals.

The sum X5 contains the sum of spectral lines (N) for a given spectrum number. For example, in spectrum number 4, we add a 1 for sweep 1, a 1 for sweep 2, a $\emptyset$ for sweep 3. Then the average sum X6 is sum $X_6$ divided by N or 6/2 for spectrum number 4.

After each value in X6 has been divided by its corresponding value in $X_5$, the peaks are extracted from X6 and transferred to X4. An interpolation (see Section 4.1.3) is performed on the peak and its neighbors. The index is adjusted accordingly and stored in the corresponding 1 of 50 locations.

The relative product moment correlation coefficient can be calculated according to $$C_R = \int_{D_x} \int_{D_y} \int_{D_z} (x - \psi)(y - \eta)(z - \xi) = $$

$$A(x,y,z)dx\, dy\, dz \ldots$$

where
x, y and z are FFT spectral index variables,
$\psi$, $\eta$ and $\xi$ are respective mean values,
$A(x,y,z)$ is the amplitude distribution, and
Di's are the domains of interest.
This integral is digitally approximated and calculated for each peak. Due to quantizing in sampling, amplitude conversion, FFT resolution, limited averaging, non-linearity in the system, noise, natural harmonic content of the ripple waveform, finite sweep length, imperfect source levelling, etc., there are errors in the correlation coefficient obtainable. The effect of any one error source can be minimized by one or more of the measures of: more complex hardware, longer measuring time, longer processing (FFT and correlation) and wider sweep.

The parameters of the embodiment shown demonstrates one suggested trade-off. In this unit, by computation and verification tests, the measured location of a single short most probably will not show any change, or at most will change by one resolution quantum ($\Delta L$), in case a spectrally pure foreign signal of frequency $f=fc$, where fc=sweep center frequency is inputted into the transmission line with an amplitude 40 db higher than the amplitude of the swept measuring signal. In general, frequency modulation of the foreign signal results in easier rejection while amplitude modulation is somewhat more difficult to discriminate against.

What is claimed is:

1. A transmission line analyzer for automatically sensing at least the location of discontinuities in said transmission line to be tested comprising:
   means for sweeping a radio frequency signal over a predetermined bandwidth for a predetermined one sweep time and connectable to said line to be tested;
   frequency domain reflectometer means for providing a complex, composite, time-varying signal which is a swept frequency interference pattern containing said location information;
   fast fourier transform means for automatically processing said complex signal to determine spectral peaks;
   means for converting said spectral peaks to said location of said discontinuities;
   means for changing said one sweep time to another sweep time;
   means for storing spectral peaks for each said sweep time;
   and means for rejecting all spectral peaks that do not have a matching peak for each sweep time.

2. A transmission line analyzer for automatically sensing at least the location of discontinuities in said transmisson line to be tested comprising:
   means for sweeping a radio frequency signal over at least two predetermined and different bandwidths;
   frequency domain reflectometer means for providing a complex, composite, time-varying signal which is a swept frequency interference pattern containing said location information;
   fast fourier transform means for automatically processing said complex signal to determine spectral peaks;

means for converting said spectral peaks to said location of said discontinuities;
means for storing spectral peaks for each said bandwidth;
and means for retaining all spectral peaks that shift in a ratio equivalent to the ratio of said bandwidths and for rejecting all spectral peaks that have a matching peak for each bandwidth.

3. A transmission line analyzer for automatically sensing at least the location of discontinuities in said transmission line to be tested and eliminating harmonic signals comprising:
frequency domain reflectometer means for providing a complex, composite, time-varying signal containing said location information;
fast fourier transform means for automatically processing said complex signal to determine spectral peaks;
a reference cable of predetermined length; p1 means for storing first spectral peaks with said cable physically added to said transmission line;
means for storing second spectral peaks without said cable added;
means for comparing said first spectral peaks with said second spectral peaks, with the equivalent length of said reference cable arithmetically added, and rejecting all peaks that do not have a corresponding peak;
and means for converting said remaining spectral peaks to said locations of said discontinuities.

4. A transmission line analyzing method for automatically sensing at least the location of discontinuities in said transmission line to be tested and eliminating harmonic signals comprising:
using a frequency domain reflectometer method for providing a complex, composite, time-varying signal containing said location information;
by the fast fourier transform method automatically processing said complex signal to determine spectral peaks;
providingg a reference cable of predetermined length;
storing first spectral peaks with said cable physically added to said transmission line;
storing second spectral peaks without said cable added;
comparing said first spectral peaks with said second spectral peaks, with the equivalent length of said reference cable arithmetically added, and rejecting all peaks that do not have a corresponding peak;
and converting said remaining spectral peaks to said locations of said discontinuities.

5. A method as in claim 4 including the step of electrically shorting said reference cable to provide a spectral peak representing said equivalent length.

* * * * *